(12) United States Patent
Cheung et al.

(10) Patent No.: US 12,432,871 B2
(45) Date of Patent: Sep. 30, 2025

(54) DEVICES, SYSTEMS, AND METHODS FOR LOCKING A SERVER IN A RACK

(71) Applicant: Microsoft Technology Licensing, LLC, Redmond, WA (US)

(72) Inventors: Rick Chun Kit Cheung, Lynwood, WA (US); Luke Thomas Gregory, Mercer Island, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 314 days.

(21) Appl. No.: 17/840,355

(22) Filed: Jun. 14, 2022

(65) Prior Publication Data

US 2023/0403812 A1 Dec. 14, 2023

(51) Int. Cl.

| | |
|---|---|
| *G06F 1/16* | (2006.01) |
| *E05B 63/00* | (2006.01) |
| *H05K 5/00* | (2025.01) |
| *H05K 7/00* | (2006.01) |
| *H05K 7/14* | (2006.01) |

(52) U.S. Cl.
CPC .......... *H05K 7/1408* (2013.01); *E05B 63/00* (2013.01); *E05B 2063/0026* (2013.01)

(58) Field of Classification Search
CPC .................. H05K 7/1408; E05B 63/00; E05B 2063/0026
See application file for complete search history.

(56) References Cited

U.S. PATENT DOCUMENTS

| | | | | |
|---|---|---|---|---|
| 6,115,242 | A * | 9/2000 | Lambrecht | G06F 1/183 361/802 |
| 6,239,975 | B1 * | 5/2001 | Otis | G06F 1/186 361/825 |
| 9,450,358 | B2 * | 9/2016 | Ehlen | H05K 7/1492 |
| 9,985,403 | B1 * | 5/2018 | Herring | H01R 41/00 |
| 10,673,189 | B2 * | 6/2020 | Mulfinger | H05K 7/1457 |
| 10,939,576 | B2 * | 3/2021 | Horning | H05K 7/1491 |
| 11,444,399 | B2 * | 9/2022 | Sabo | H01R 12/721 |
| 2006/0139149 | A1 | 6/2006 | Faro et al. | |
| 2010/0277866 | A1 | 11/2010 | Chen et al. | |
| 2014/0308828 | A1 * | 10/2014 | Ehlen | H05K 7/1492 439/110 |
| 2015/0240531 | A1 | 8/2015 | Blust et al. | |

(Continued)

FOREIGN PATENT DOCUMENTS

| | | |
|---|---|---|
| WO | 2014142234 A1 | 9/2014 |
| WO | 2015100189 A1 | 7/2015 |
| WO | 2017196319 A1 | 11/2017 |

OTHER PUBLICATIONS

"Invitation To Pay Additional Fees Issued in PCT Application No. PCT/US23/019536", Mailed Date: Jul. 13, 2023, 15 Pages.

(Continued)

*Primary Examiner* — Anthony M Haughton
(74) *Attorney, Agent, or Firm* — Ray Quinney & Nebeker P.C.; Paul N. Taylor

(57) ABSTRACT

A rack security system includes a locking mechanism connected to a server. The locking mechanism is configured to lock onto the busbar of a rack. When the locking mechanism is locked to the busbar, the locking mechanism may prevent removal of the server from the rack. When the locking mechanism is unlocked, the server may be removable from the rack.

22 Claims, 15 Drawing Sheets

(56) References Cited

U.S. PATENT DOCUMENTS

| | | | | |
|---|---|---|---|---|
| 2017/0164505 A1* | 6/2017 | Sarti | .................... | H01R 25/142 |
| 2019/0052034 A1* | 2/2019 | Orris | .................... | H01R 25/142 |
| 2019/0069436 A1 | 2/2019 | Norton et al. | | |
| 2019/0215979 A1* | 7/2019 | Chen | .................... | H05K 7/1492 |
| 2020/0107461 A1 | 4/2020 | Chia et al. | | |
| 2020/0378152 A1* | 12/2020 | Zhang | ....................... | E05C 3/24 |
| 2022/0283614 A1* | 9/2022 | Gao | ........................ | G06F 1/189 |
| 2023/0056298 A1* | 2/2023 | Gao | .................... | H05K 7/20772 |
| 2024/0088601 A1* | 3/2024 | Liu | ....................... | H01R 13/518 |
| 2024/0088612 A1* | 3/2024 | Liu | ...................... | H01R 25/162 |

OTHER PUBLICATIONS

"International Search Report and Written Opinion Issued in PCT Application No. PCT/US23/019536", Mailed Date: Sep. 4, 2023, 20 Pages.

* cited by examiner

DEVICES, SYSTEMS, AND METHODS FOR LOCKING A SERVER IN A RACK

CROSS-REFERENCE TO RELATED APPLICATIONS

N/A.

BACKGROUND

Remote computing, including cloud computing and other Internet services, is often performed at a datacenter. The datacenter includes a plurality of racks, and each rack includes a plurality of server devices. The server devices may perform storage and/or computing tasks for one or more clients. In some situations, the server devices may store sensitive, proprietary, or otherwise confidential information. The owners of the server devices and/or the information stored thereon may desire such information to remain secure.

BRIEF SUMMARY

In some aspects, the techniques described herein relate to a server in a rack of servers. The server includes a support structure, a processor on the support structure, and a locking mechanism connecting the support structure to a busbar, the locking mechanism preventing removal of the support structure from the rack of servers.

In some aspects, the techniques described herein relate to a rack in a datacenter. The rack includes a housing, a plurality of servers located in the housing, a busbar connected to the housing and configured to provide power to the plurality of servers, and a locking mechanism preventing removal of the plurality of servers from the rack by locking the plurality of servers to the busbar.

In some aspects, the techniques described herein relate to a method for rack security. The method includes monitoring a position of a locking mechanism, the locking mechanism being adjustable between an unlocked position and a locked position. In the unlocked position, the locking mechanism is locked to a busbar and prevents removal of a server from a rack. The busbar is connected to the rack. In the locked position, the server is removable from the rack. A rack security system receives an input to adjust a position of the locking mechanism from the locked position to the unlocked position. Based on the input, the locking mechanism is actuated to adjust the position from the locked position to the unlocked position such that the server is removable from the rack.

This summary is provided to introduce a selection of concepts that are further described below in the detailed description. This summary is not intended to identify key or essential features of the claimed subject matter, nor is it intended to be used as an aid in limiting the scope of the claimed subject matter.

Additional features and advantages of embodiments of the disclosure will be set forth in the description which follows, and in part will be obvious from the description, or may be learned by the practice of such embodiments. The features and advantages of such embodiments may be realized and obtained by means of the instruments and combinations particularly pointed out in the appended claims. These and other features will become more fully apparent from the following description and appended claims, or may be learned by the practice of such embodiments as set forth hereinafter.

BRIEF DESCRIPTION OF THE DRAWINGS

In order to describe the manner in which the above-recited and other features of the disclosure can be obtained, a more particular description will be rendered by reference to specific implementations thereof which are illustrated in the appended drawings. For better understanding, the like elements have been designated by like reference numbers throughout the various accompanying figures. While some of the drawings may be schematic or exaggerated representations of concepts, at least some of the drawings may be drawn to scale. Understanding that the drawings depict some example implementations, the implementations will be described and explained with additional specificity and detail through the use of the accompanying drawings in which:

FIG. 4-1 through FIG. 4-4 fare representations of a top-down view of a server, according to at least one embodiment of the present disclosure;

FIG. 6-1 through FIG. 6-3 are representations of a side view of a rack, according to at least one embodiment of the present disclosure;

DETAILED DESCRIPTION

Figure 1:
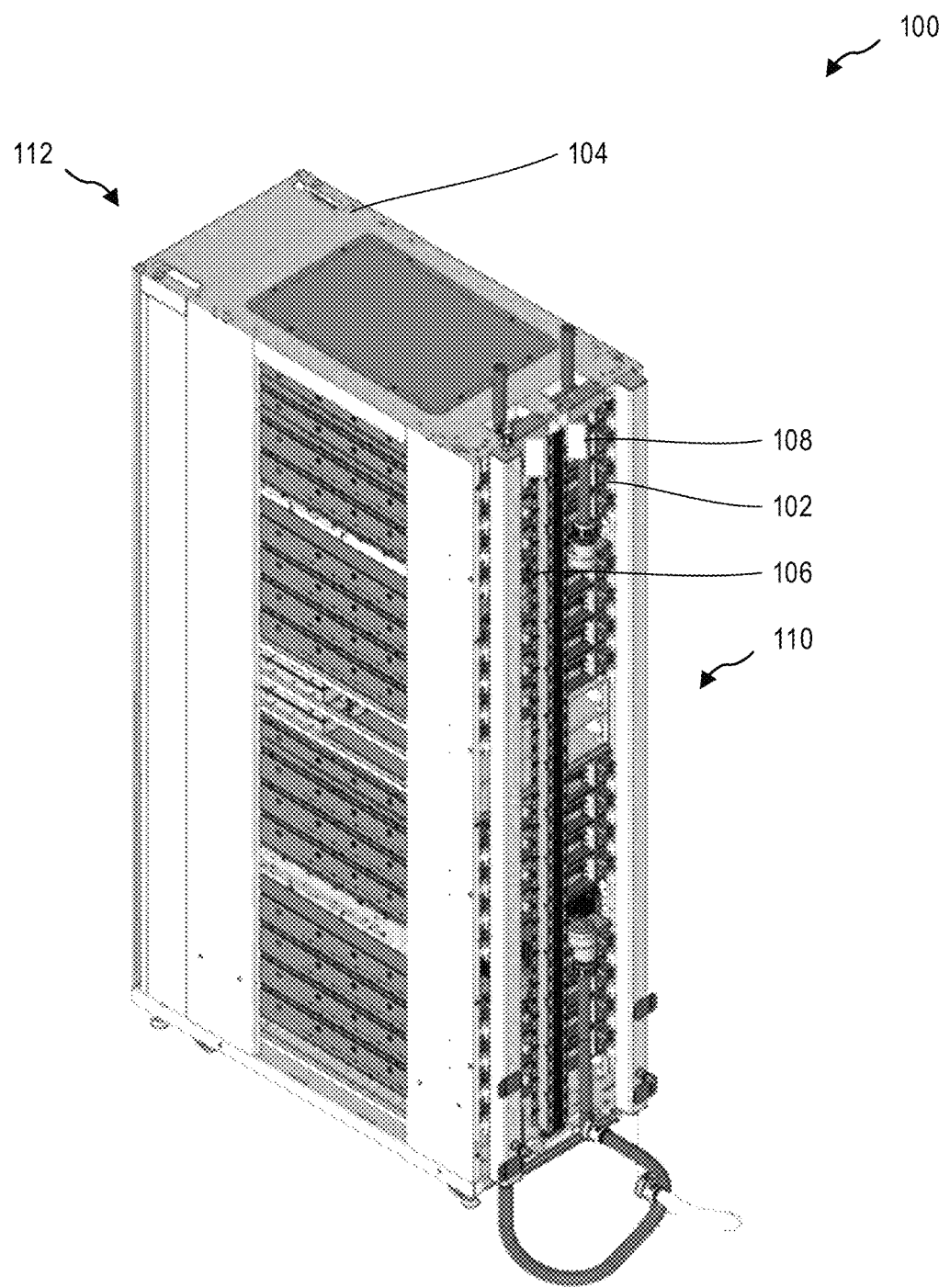
FIG. 1 is a perspective rear view of a rack of server devices, according to at least one embodiment of the present disclosure.

This disclosure generally relates to devices, systems, and methods for securing and locking a server to a rack, thereby improving data security by limiting physical access to a server. Maintaining data security includes not only digital security, such as from digital intrusion, but security from physical access to server devices. A bad actor desiring to steal, alter, delete, or otherwise damage data stored on a server device may perform one or more of these activities through physical access to the server device. Conventionally, access to server devices is controlled by limiting access to a datacenter or other physical location of the server device (such as the building or room in which the server device is stored). A technician performing maintenance on a particular server device may have access to all of the server devices at that physical location, including server devices that are unrelated to the technician's maintenance. Such access may be a security risk to data stored on the unrelated server devices.

In accordance with at least one embodiment of the present disclosure, a rack security system includes a locking mechanism locks the server device to a busbar of the rack. The locking mechanism may be connected to the support structure of the server. In a locked position, the locking mechanism may be latched to the busbar. Because the busbar is secured to the rack, the locking mechanism may prevent removal of the server from the rack in the locked position. To remove the server from the rack, the locking mechanism may receive a command to unlock or unlatch from the busbar. Once the locking mechanism unlocks from the busbar, the server may be removed from the rack for service, replacement, or other reasons. In this manner, the server may be removed by an authorized technician or other authorized user. This may help to prevent unauthorized access to the physical server devices, thereby increasing the data security of information stored on the server devices.

In some embodiments, the rack security system may include a monitoring system that may monitor a position of the locking mechanism. For example, the rack security system may include a sensor. The sensor may detect when the locking mechanism is in the locked position and an unlocked position. As will be discussed in further detail herein, the sensor may continuously monitor the locking mechanism, such as by taking position measurements periodically. In some embodiments, the sensor may be a position sensor that sends no signal when the locking mechanism is in the locked position, and sends a signal when the locking mechanism is in the unlocked position. When the rack security system detects that the locking mechanism is in the unlocked position, the rack security system may send an alert to a rack manager, such as a remote computing device, technician, server management system, or other element. In this manner, the rack manager may detect when a server is unlocked, thereby allowing physical access to the server.

FIG. 1 is a perspective rear view of a rack 100 of server devices 102, according to at least one embodiment of the present disclosure. The rack 100 includes a housing 104, and the server devices 102 may be inserted into an interior of the housing 104. A busbar 106 may be connected to the housing 104. The busbar 106 may provide power to the server devices 102 and other computing equipment located in the housing 104.

The server devices 102 may provide computing services for one or more client devices. For example, the rack 100 may be a part of a datacenter that provides remote computing services, such as cloud computing services. The server devices 102 may have one or more virtual machines installed thereon. The virtual machines may include software services, including computing services, remote storage services, and any other remote computing service.

In some situations, the data stored on the server devices 102 may be sensitive or private. For example, the data stored on the server devices 102 may include personal information, confidential information, proprietary information, privileged information, unpublished intellectual property (including patents, trademarks, copyrights, and trade secrets), any other sensitive or private information, and combinations thereof. In some examples, the data stored on the server devices 102 may include confidential or proprietary software programs. To prevent access to the data stored on the server devices 102, the operator of the rack 100 may implement one or more security measures. For example, the operator may implement digital security measures, such as firewalls or other digital security measures. In some examples, the operator may prevent physical access to the server devices 102.

Conventionally, to prevent physical access to the server devices 102, the operator may control access to the building or room in which the rack 100 is located. For example, the operator may lock the building or room in which the rack 100 is located to prevent unauthorized users from entering. However, in some situations, the building or room may include multiple server devices 102 and/or multiple racks 100. A technician or other person that has access to a single server device 102 may have access to all of the server devices 102 in the building or room. In this manner, while the technician may be authorized to access a particular server device 102, the technician may not be authorized to access one or more of the other server devices 102 in the building or room. This may present a security risk to data stored on the server devices 102.

In accordance with at least one embodiment of the present disclosure, the rack 100 may include a locking mechanism 108. The locking mechanism 108 may be connected to a support structure of the server device 102, such as the tray or other support structure of the server device 102. The locking mechanism 108 may selectively lock to the housing 104 of the rack 100. For example, the locking mechanism 108 may selectively lock to the busbar 106. Because the busbar 106 is connected to the housing 104, when the locking mechanism 108 locks to the busbar 106, the locking mechanism 108 may secure the server device 102 to the housing 104 of the rack 100. This may help to prevent removal of the server device 102 from the housing 104 of the rack 100, thereby preventing physical access to the server device 102.

In some embodiments, the locking mechanism 108 may lock a single server device 102 to the locking mechanism 108. In some embodiments, the locking mechanism 108 may lock multiple server devices 102 to the busbar 106. For example, the locking mechanism 108 may lock 2, 3, 4, 5, 6, 7, 8, 9, 10, or more server devices 102 to the busbar 106. In some examples, the locking mechanism 108 may lock all of the server devices 102 to the busbar 106.

In some embodiments, the locking mechanism 108 may be electronically controlled. For example, the locking mechanism 108 may include one or more electronic elements, such as a solenoid, a servomotor, a linear motor, any other electronic element, and combinations thereof. The electronic element of the locking mechanism 108 may be actuated to move the locking mechanism 108 between the locked position and the unlocked position.

In some embodiments, the locking mechanism 108 may be remotely actuated. For example, a rack controller or operator may include a remote computing device. The remote computing device may authorize access to one or more server devices 102. For example, a particular server device 102 may be scheduled for maintenance and/or replacement. The rack controller or operator may cause the remote computing device to instruct the locking mechanism 108 associated with the server device 102 to be maintained and/or replaced to move from the locked position to the unlocked position. Any remaining locking mechanisms 108 may not be unlocked, or may continue to secure the remaining server devices 102 to the busbar 106. In this manner, only the server devices 102 to which the technician is authorized to access may be removable from the housing 104 of the rack 100. This may help to prevent unauthorized access to the server devices 102, thereby improving the data security of the information stored on the server devices 102 of the rack 100.

The busbar 106 may be connected to a rear end 110 of the housing 104. As may be seen, the connection of the busbar 106 to the housing 104 may prevent removal of the server devices 102 from the housing 104 through the rear end 110 of the housing 104. The server devices 102 may be removable from the housing 104 through a front end 112 of the housing 104.

In some embodiments, the server devices 102 may be biased toward the front end 112 of the housing 104. When inserted into the housing 104, the server devices 102 may be connected to the busbar 106 with the locking mechanism 108. The connection between the server devices 102 and the busbar 106 may prevent the server devices 102 from being pushed out of the front end 112 of the housing 104. When the locking mechanism 108 is moved into the unlocked position, a biasing element may push the server devices 102 toward the front end 112 of the housing 104. In some embodiments, at least a portion of the server devices 102 may extend out of the front end 112 of the housing 104. In this manner, a visual inspection of the rack 100 may easily or readily indicate that the one or more of the server devices 102 may be unlocked from the busbar 106. This may help to improve data security by allowing the technician to provide a visual cue to indicate whether the correct server device 102 is unlocked and prepared for removal from the rack 100.

Figure 2:
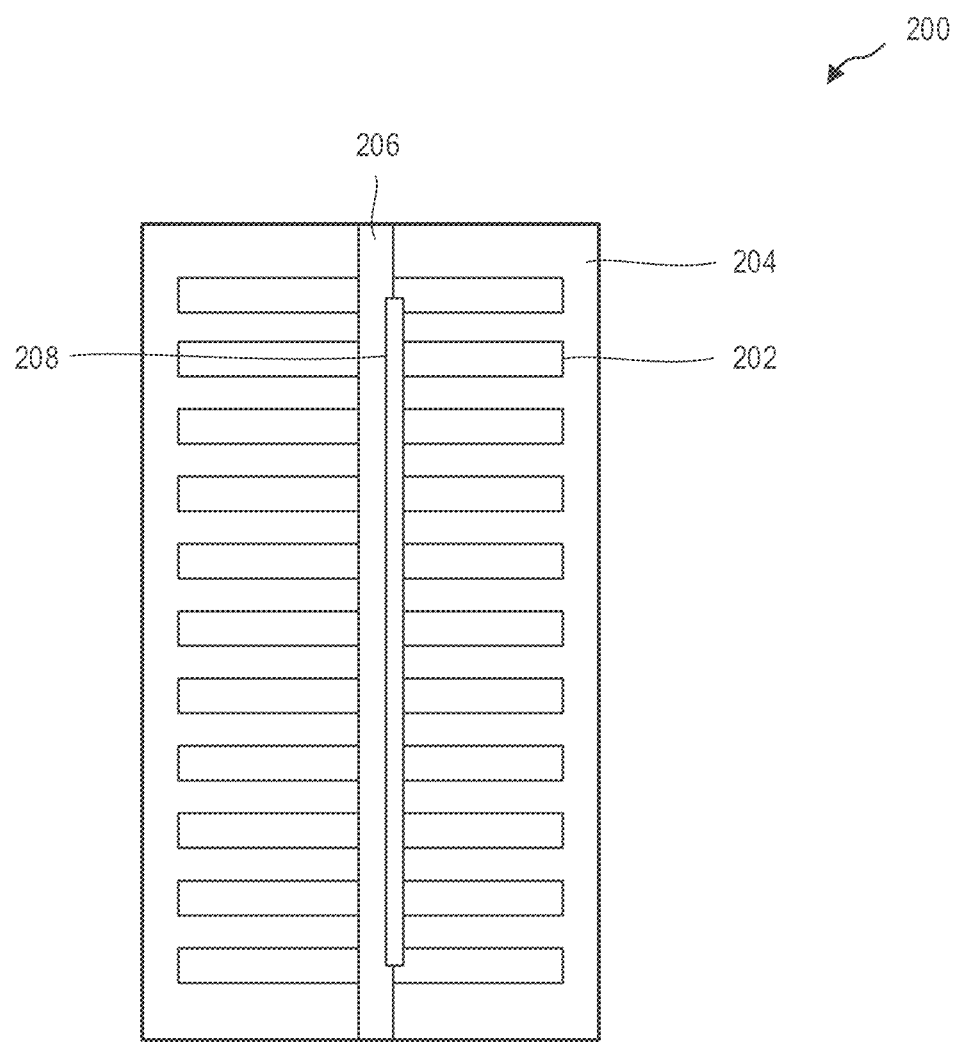
FIG. 2 is a view of a rear end of a rack, according to at least one embodiment of the present disclosure.

FIG. 2 is a view of a rear end of a rack 200, according to at least one embodiment of the present disclosure. The rack 200 may include a housing 204 with a plurality of server devices 202 installed in the housing 204. A busbar 206 may be connected to the housing 204 and provide power to the server devices 202. In the embodiment shown, the busbar 206 is connected to a center of the housing 204 and extends from an upper end to a lower end of the housing 204. However, it should be understood that the busbar 206 may be connected to the housing 204 at any location and may extend over any length or extent of the rear end of the housing 204.

In the embodiment shown, the rack 200 includes a plurality of server devices 202. As may be understood, the housing 204 may have connections for any number of server devices 202, including 1, 2, 3, 4, 5, 6, 7, 8, 9, 10, 11, 12, 14, 16, 18, 20, 26, 32, 48, more than 48, or any number of server devices 202 therebetween. A locking mechanism 208 may secure or lock the server devices 202 to the busbar 206. In the embodiment shown, the rack 200 may include a single locking mechanism 208 to lock multiple server devices 202 to the busbar 206. For example, the locking mechanism 208 may lock all of the server devices 202 in the rack 200 to the busbar 206. In some embodiments, the locking mechanism 208 may lock any number of server devices 202 to the busbar 206. For example, the locking mechanism 208 may lock 2, 3, 4, 5, 6, 7, 8, 9, 10, 11, 12, 14, 16, 18, 26, 32, 48, more than 48, or any number of server devices 202 to the busbar 206.

In some embodiments, the locking mechanism 208 may lock similar server devices 202 to the busbar 206. For example, the locking mechanism 208 may lock server devices 202 owned by the same company to the busbar 206. In some examples, the locking mechanism 208 may lock server devices 202 leased by the same company to the busbar 206. In some examples, the locking mechanism 208 may lock server devices 202 running the same or similar virtual machines to the busbar 206. In some examples, the locking mechanism 208 may lock server devices 202 having a single client's data stored thereon to the busbar 206. In some examples, the locking mechanism 208 may lock server devices 202 having the same or similar data stored thereon to the busbar 206. In some examples, the locking mechanism 208 may lock server devices 202 having any other correlation, relation, or connection to the busbar 206. In some embodiments, locking multiple related server devices 202 to the busbar 206 may reduce the data security risk by only allowing a technician access to related information, while unrelated server devices 202 are inaccessible. In some examples, the locking mechanism 208 may lock unrelated server devices 202 to the busbar 206.

Figure 3:
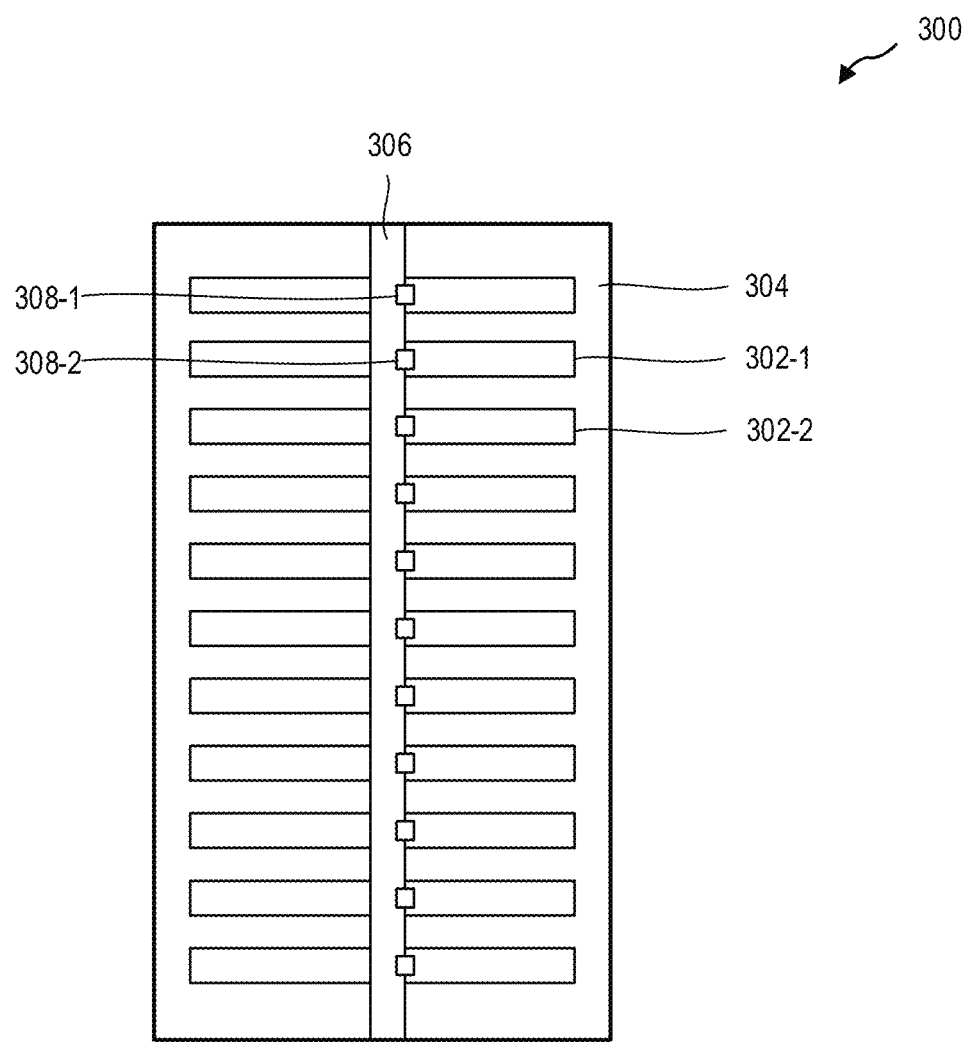
FIG. 3 is a view of a rear end of a rack, according to at least one embodiment of the present disclosure.

FIG. 3 is a view of a rear end of a rack 300, according to at least one embodiment of the present disclosure. The rack 300 may include a housing 304 with a plurality of server devices (collectively 302) installed in the housing 304. A busbar 306 may be connected to the housing 304 and provide power to the server devices 302. In the embodiment shown, the rack 300 includes a plurality of server devices 302.

In accordance with at least one embodiment of the present disclosure, the rack 300 may include a plurality of locking mechanisms (collectively 308). The locking mechanisms 308 may lock the server devices 302 to the busbar 306. In some embodiments, each server device 302 may include an associated locking mechanism 308. For example, a first server device 302-1 may include an associated first locking mechanism 308-1, a second server device 302-2 may include an associated second locking mechanism 308-2, and so forth.

In some embodiments, each of the locking mechanisms 308 may be individually actuatable. For example, the first locking mechanism 308-1 may be able to actuate independent of and separately from the second locking mechanism 308-2. This may allow the operator of the rack 300 to selectively unlock a particular locking mechanism 308 while leaving other locking mechanisms 308 locked. For example, a technician may be authorized to remove the first server device 302-1 from the rack 300 but may not be authorized to remove the second server device 302-2 from the rack 300. For the technician to access the first server device 302-1, the operator of the rack 300 may unlock the first locking mechanism 308-1 while the second locking mechanism 308-2 remains locked to the busbar 306. Put another way, the technician may unlock only the first locking mechanism 308-1 without unlocking the second locking mechanism 308-2. This may prevent unauthorized access to the second server device 302-2 by the technician while allowing access the first server device 302-1. As may be seen, the first server device 302-1 and the second server device 302-2 may be located in the same housing 304 of the rack 300. Selective unlocking of the locking mechanisms 308 may allow for authorized access to or removal of a single server device 302 from the rack 300, while restricting unauthorized access to other server devices 302 in the same rack 300.

While the first locking mechanism 308-1 and second locking mechanism 308-2 are discussed herein as being independently actuatable, it should be understood that any of the locking mechanisms 308 connected to the busbar 306 may be independently actuatable from each other. In this manner, an operator may selectively provide access to the server devices 302 to a technician, robotic access system, or other person or system. This may help to improve the physical security of the server devices 302 in the rack 300.

In accordance with at least one embodiment of the present disclosure, the server devices 302 may include a position sensor. The position sensor may detect the position of the locking mechanisms 308. For example, the position sensor may detect whether the locking mechanisms 308 are open or closed. Detecting the position of the locking mechanisms 308 may allow the operator to determine whether a particular server device 302 is locked or unlocked from the busbar 306. The operator may compare which server devices 302 are unlocked to the which server devices 302 are authorized to be unlocked. In some embodiments, the server devices 302 may be connected to a rack security system. The rack security system may send an alert to the operator based on which server devices 302 are unlocked. For example, the rack security system may send an alert to the operator if the unlocked server device 302 is not authorized to be unlocked. In this manner, the rack security system may identify unauthorized access to server devices 302.

Figures 1, 4:
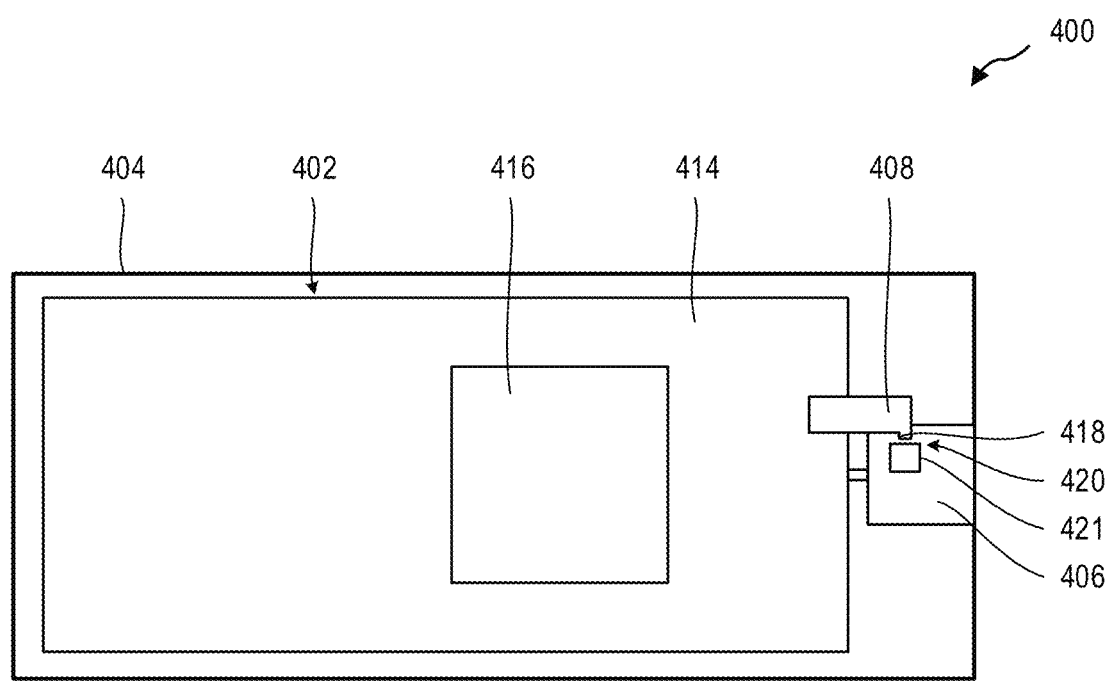
Figures 2, 4:
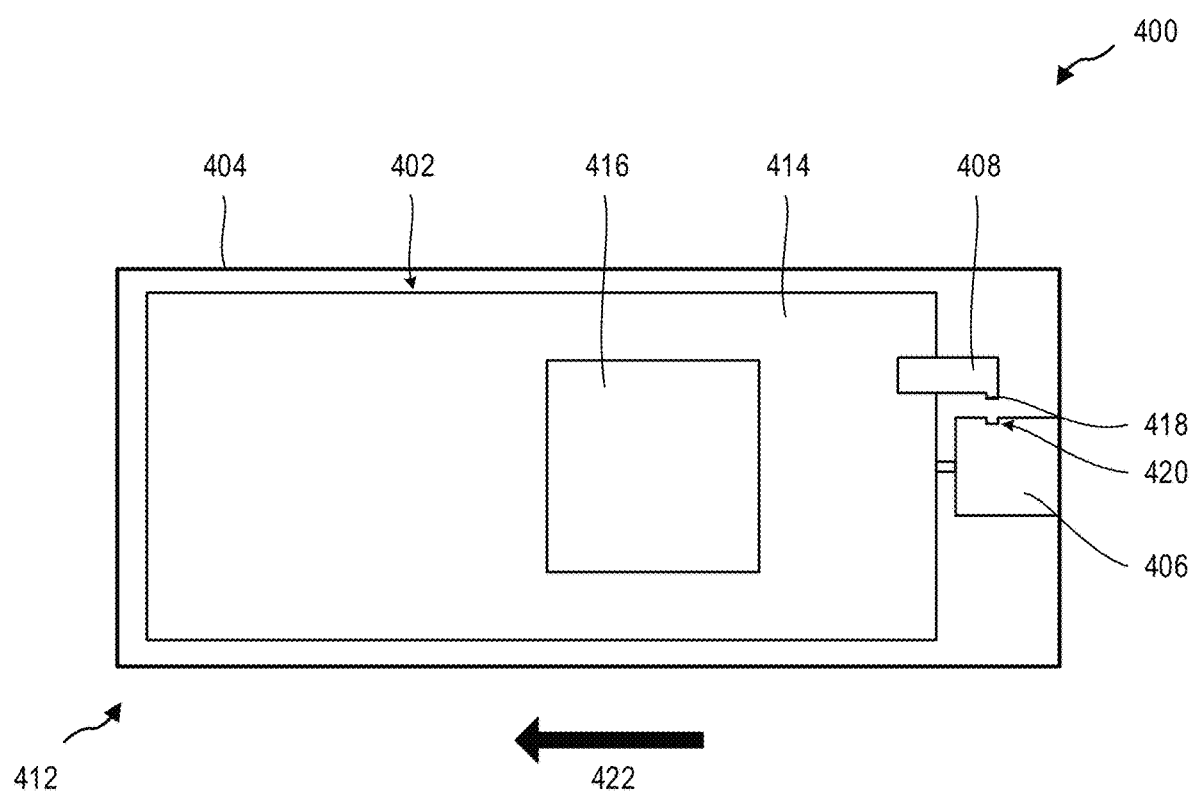
Figures 3, 4:
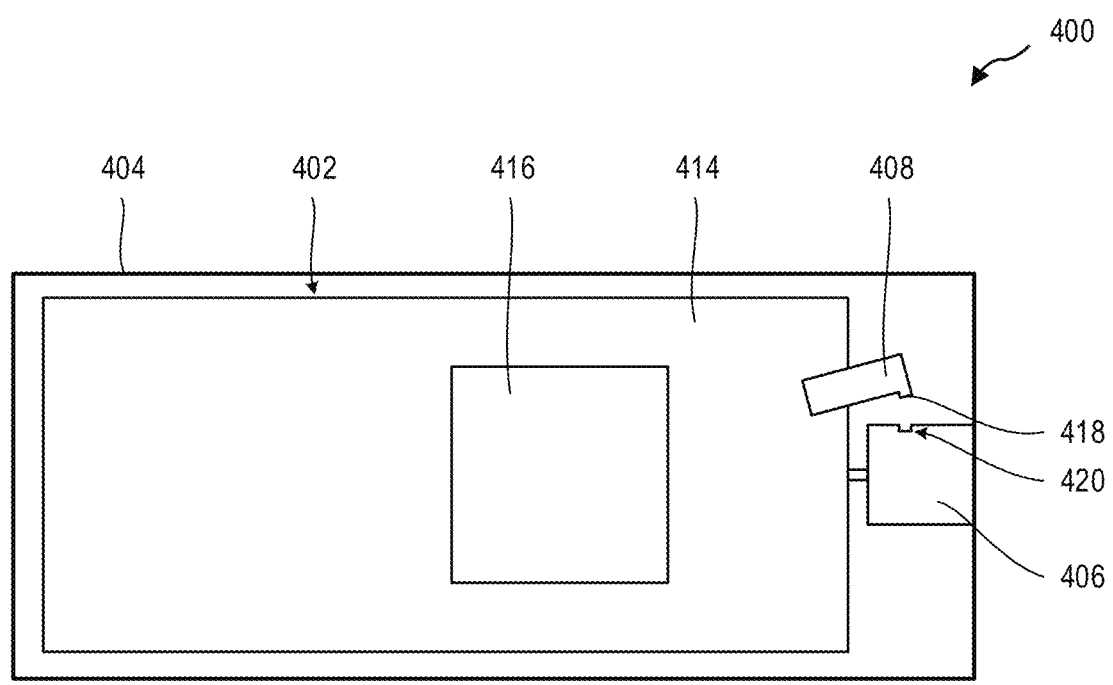
Figure 4:
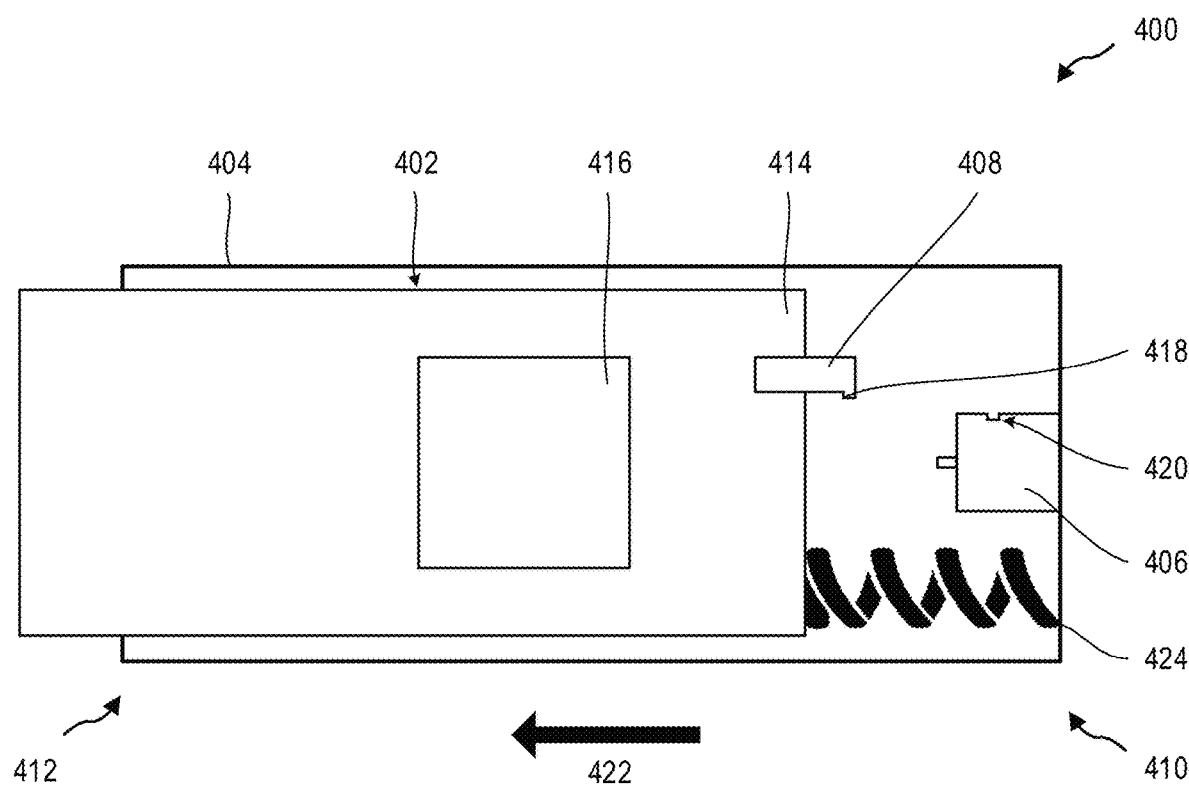

FIG. 4-1 is a representation of a top-down view of a rack 400 having a busbar 406 connected to a housing 404, according to at least one embodiment of the present disclosure. A server device 402 includes a support structure 414 and a processor 416. The server device 402 is supported in the housing 404 of the rack 400 by the support structure 414. In some embodiments, the processor 416 may be powered by the busbar 406.

In accordance with at least one embodiment of the present disclosure, the server device 402 may be locked to the busbar 406 with a locking mechanism 408. The locking mechanism 408 may be associated with the server device 402. Because the busbar 406 is connected to the housing 404, locking the server device 402 to the busbar 406 with the locking mechanism 408 may lock the server device 402 to the housing 404. As discussed herein, this may help to reduce unauthorized access to the server device 402.

In some embodiments, the locking mechanism 408 may be connected to the support structure 414. When the locking mechanism 408 is locked to the busbar 406, the locking mechanism 408 may lock the support structure 414 to the busbar 406. Because the processor 416 is connected to the support structure 414, the locking mechanism 408 may lock the processor 416 to the housing 404. This may help to reduce or prevent unauthorized access to the server device 402 and/or the processor 416.

In the view shown in FIG. 4-1, the locking mechanism 408 is in the locked position (e.g., the closed position). The locking mechanism 408 includes a latch 418. In the locked position, the latch 418 may be inserted into a groove 420, depression, hole, or other element of the busbar 406. In this manner, in the locked position, the latch 418 of the locking mechanism 408 may be secured to the busbar 406, thereby preventing removal of the server device 402 from the housing 404 of the rack 400. In some embodiments, preventing removal of the server device 402 from the housing 404 may include preventing removal of the server device 402 from the housing 404 without damage (e.g., fracture, plastic deformation) to the locking mechanism 408, the latch 418, the busbar 406, the server device 402, the support structure 414, the processor 416, the housing 404, any other element of the rack 400, and combinations thereof.

In accordance with at least one embodiment of the present disclosure, the locking mechanism 408 may include a status sensor 421. The status sensor 421 may detect a position of the locking mechanism 408. For example, the status sensor 421 may detect whether the locking mechanism 408 is in the locked position or the unlocked position. The status sensor 421 may communicate the position of the locking mechanism 408 with a rack manager or other controller. This may allow the rack manager to determine which server devices 402 are connected or disconnected to the busbar 406 and are therefore locked to the housing 404. This may help to improve the physical security of the server device 402 by identifying unauthorized removal of the server device 402 from the busbar 406.

The status sensor 421 may be any type of sensor, such as a position sensor, an infrared sensor, a magnetic sensor, an electronic circuit, any other type of sensor, and combinations thereof. In some embodiments, the status sensor 421 may be located on the busbar 406. In some embodiments, the status sensor 421 may be located on the locking mechanism 408, such as on the latch 418. In some embodiments, the status sensor 421 may periodically measure the status or position of the locking mechanism 408. For example, the status sensor 421 may measure the status or position of the locking mechanism 408 once a minute (0.017 Hz), once every 30 seconds (0.033 Hz), once every seconds (0.067 Hz), once every 10 seconds (0.1 Hz), once every 5 seconds (0.2 Hz), once a second (1 Hz), twice a second (1 Hz), 5 times a second (5 Hz), 10 times a second (10 Hz), 100 times a second (100 Hz), or any rate therebetween. This may allow the status sensor 421 to continuously monitor the position of the locking mechanism 408. In some embodiments, the status sensor 421 may only generate a signal when the locking mechanism 408 is in a particular position. For example, a proximity sensor may only generate a signal when the locking mechanism 408 is in a particular position. This may increase the simplicity of monitoring the position of the locking mechanism 408.

The locking mechanism 408 may be movable between the locked position shown in FIG. 4-1 and an unlocked position. For example, in FIG. 4-2, the locking mechanism 408 has been moved laterally (e.g., has translated) away from the busbar 406 into an unlocked position. This may move the latch 418 out of the groove 420. As may be seen, when the latch 418 is removed from the groove 420, the server device 402 may be removed from the housing. For example, the support structure 414 may be moved in a frontward direction 422 toward a front end 412 of the housing 404. The server device 402 may then be removed from the housing 404 at the front end 412 of the housing 404 without damaging any portion of the rack 400.

In some embodiments, the locking mechanism 408 may include an electronic motive element. For example, the locking mechanism 408 may include a solenoid, a servomotor, a linear motor, any other motive element, and combinations thereof. To actuate the locking mechanism 408, the electronic motive element may receive an electronic signal. For example, the locking mechanism 408 may receive a signal or instruction from a rack manager or operator to actuate the locking mechanism 408. This may cause the electronic motive element to move between the locked position and the unlocked position. For example, the locking mechanism 408 may include a solenoid. Upon application of an electric current to the solenoid, the solenoid may cause an armature or other magnetic element to move within the conductive coils. The armature may be connected to the locking mechanism 408. In this manner, when the armature is caused to move by the application of current to the conductive coils, the armature may cause the locking mechanism 408 to move.

The locking mechanism 408 may include a biasing element to bias the latch 418 in the locked position or the unlocked position. In some embodiments, the biasing element may bias the latch 418 in the locked position when the locking mechanism 408 is unpowered. The server device 402 may remain locked to the housing 404 unless a current is actively applied to the solenoid (e.g., when the solenoid is unpowered). This may allow the server device 402 to be locked to the housing 404 even if power is removed from the rack 400. Locking the server device 402 to the housing 404 when the rack 400 is unpowered may increase the physical security of the server device 402 by preventing unauthorized removal of the server device 402 in the event of a power outage.

In FIG. 4-3, the locking mechanism 408 is rotated into the unlocked position such that the latch 418 has been removed from the groove 420. For example, the locking mechanism 408 may be connected to the support structure 414 with a pivot. When the motive element is actuated, this may rotate the locking mechanism 408 into the unlocked position. In the unlocked position shown, the latch 418 has been removed from the groove 420 and the server device 402 may be removed from the housing 404.

In some embodiments, the server device 402 may be biased toward the front end 412 of the housing 404. For example, as may be seen in FIG. 4-4, a biasing element 424 may apply a force on the support structure 414 that may push the support structure 414 toward the front end 412 of the housing 404. This may cause the support structure 414 to extend at least partially out of the housing 404. In some embodiments, the biasing element 424 may push at least a portion of the support structure 414 to extend out of the front end 412 of the housing 404. When the locking mechanism 408 is moved into the unlocked position, the biasing element 424 may push the server device 402 away from the busbar 406 until a portion of the support structure 414 is located out of (e.g., extends out of) the housing 404. The biasing element 424 may be any type of biasing element, such as a spring, a gas piston, a hydraulic piston, a compressible material, any other biasing element, and combinations thereof.

When the server device 402 is installed, the server device 402 may be pushed toward a rear end 410 of the housing 404. The installation force may overcome the biasing force from the biasing element 424 until the latch 418 of the locking mechanism 408 engages with the groove 420 on the busbar 406. When the latch 418 engages the groove 420, the engagement between the latch 418 and the groove 420 may prevent the biasing element 424 from moving the server device 402 out of the housing 404.

In accordance with at least one embodiment of the present disclosure, biasing the server device 402 toward the front end 412 may help a rack manager or operator to visually determine whether the server device 402 is installed in the busbar 406. This may help to identify which server devices 402 have been disconnected from the busbar 406. If an unauthorized server device 402 is disconnected from the busbar 406, the operator may visually identify which server device 402 is disconnected and re-connect the server device 402 to the busbar 406. This may help to improve the physical security of the rack 400 by providing a visual check on which server devices 402 are disconnected from the busbar 406.

Figure 5:
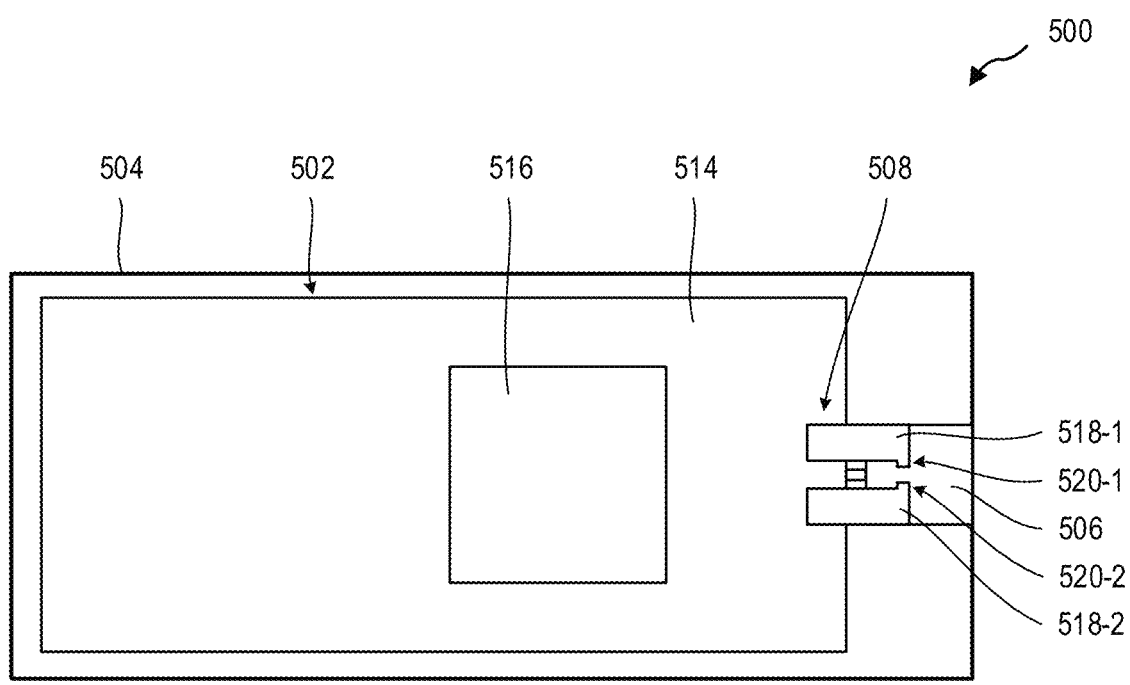
FIG. 5 is a representation of a top-down view of a rack having a busbar connected to a housing, according to at least one embodiment of the present disclosure.

FIG. 5 is a representation of a top-down view of a rack 500 having a busbar 506 connected to a housing 504, according to at least one embodiment of the present disclosure. A server device 502 includes a support structure 514 and a processor 516. The server device 502 is supported in the housing 504 of the rack 500 by the support structure 514. In some embodiments, the processor 516 may be powered by the busbar 506.

In accordance with at least one embodiment of the present disclosure, the server device 502 may be locked to the busbar 506 with a locking mechanism 508. Because the busbar 506 is connected to the housing 504, locking the server device 502 to the busbar 506 with the locking mechanism 508 may lock the server device 502 to the housing 504. As discussed herein, this may help to reduce unauthorized access to the server device 502.

In the embodiment shown, the locking mechanism 508 includes a first latch 518-1 and a second latch 518-2. The first latch 518-1 and the second latch 518-2 may be connected to the support structure 514. The first latch 518-1 may be connected to the busbar 506 on a first side of the busbar 506 and the second latch 518-2 may be connected to the busbar 506 on a second side of the busbar 506. Including two latches 518 in the locking mechanism 508 may increase the reliability of the connection of the server device 502 to the busbar 506. This may further increase the physical security of the server device 502 when the server device 502 is installed in the rack 500.

Figures 1, 6:
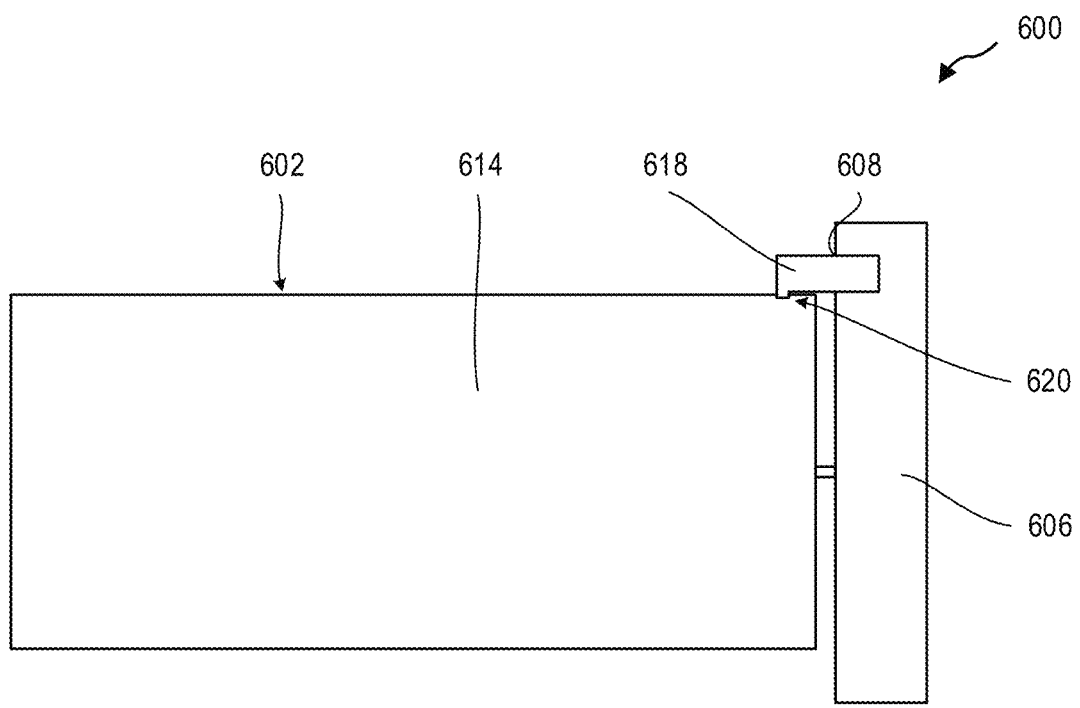
Figures 2, 6:
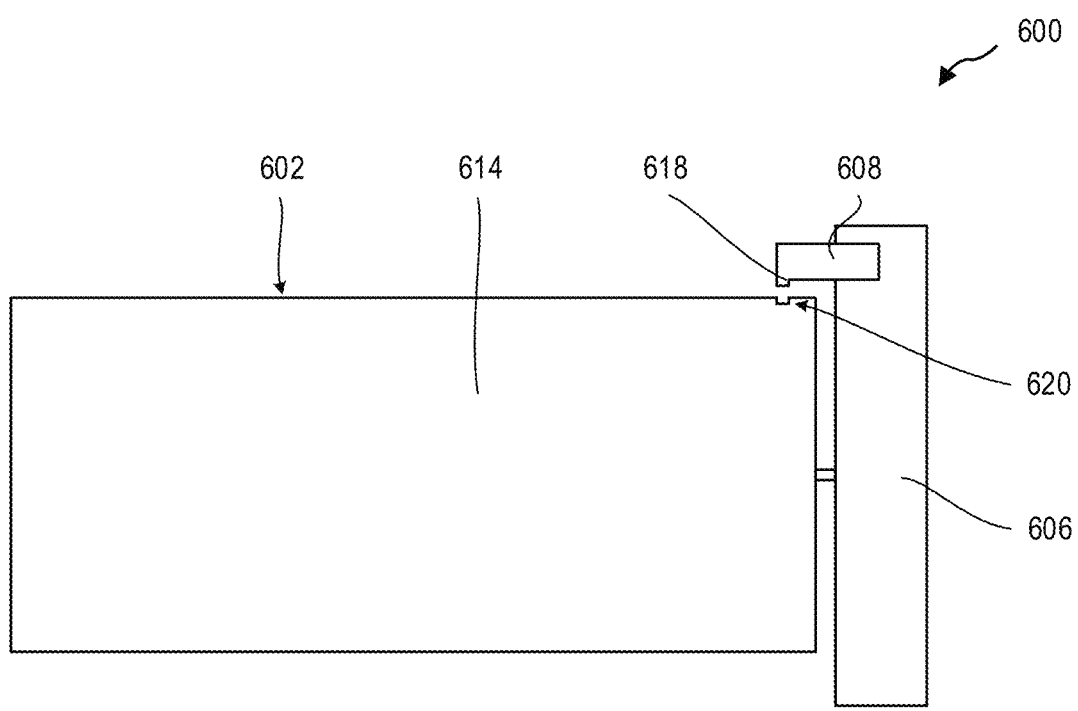
Figures 3, 6:
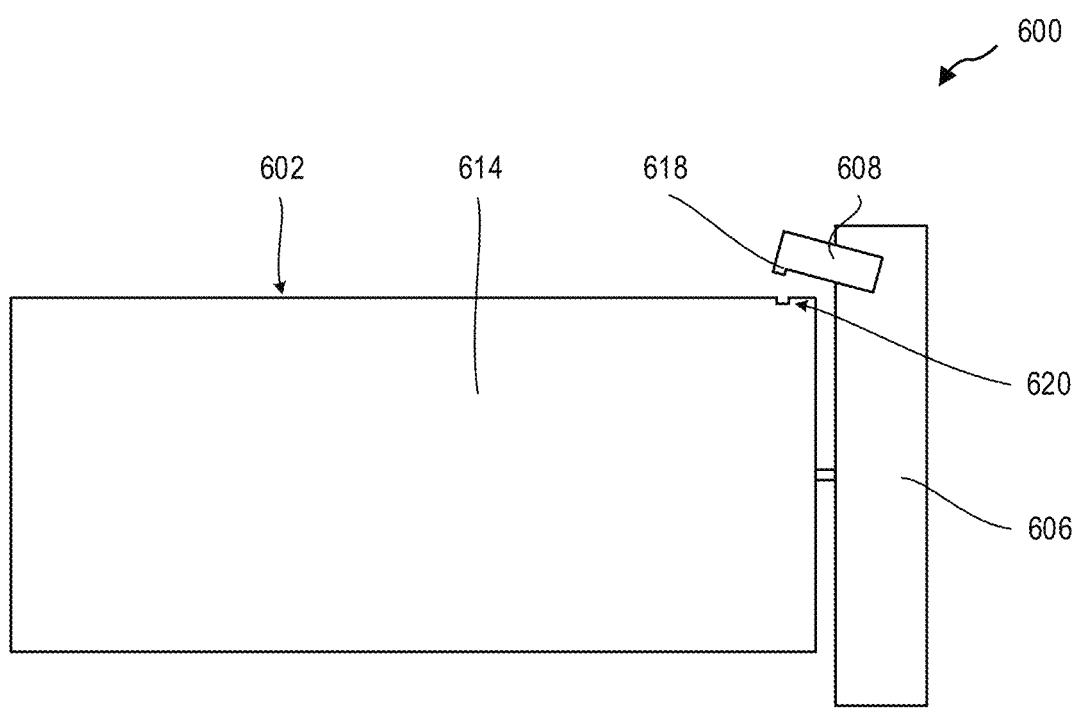

FIG. 6-1 is a representation of a side view of a rack 600 having a busbar 606 connected to a housing, according to at least one embodiment of the present disclosure. A server device 602 includes a support structure 614 and a processor. The server device 602 is supported in the housing of the rack 600 by the support structure 614. In some embodiments, the processor may be powered by the busbar 606.

In accordance with at least one embodiment of the present disclosure, the server device 602 may be locked to the busbar 606 with a locking mechanism 608. Because the busbar 606 is connected to the housing 604, locking the server device 602 to the busbar 606 with the locking mechanism 608 may lock the server device 602 to the housing 604. As discussed herein, this may help to reduce unauthorized access to the server device 602.

In the embodiment shown in FIG. 6-1, the locking mechanism 608 is connected to the busbar 606. The locking mechanism 608 includes a latch 618. The latch 618 may be inserted into a groove 620 on the support structure 614. In this manner, the locking mechanism 608 may remain connected to the busbar 606, even when moved from the locked position to the unlocked position.

When the locking mechanism 608 is moved to the unlocked position shown in FIG. 6-2, the latch 618 may be removed from the groove 620. This may allow the server device 602 to be disconnected from the 606 and removed from the housing. In some embodiments, as discussed herein, a motive element for the locking mechanism 608 may include one or more of a solenoid, a linear motor, a servomotor, any other motive element, and combinations thereof. In some embodiments, the locking mechanism 608 may move along the busbar 606 until the latch 618 is removed from the groove 620. In the embodiment shown in FIG. 6-2, the latch 618 has translated (e.g., moved linearly) along the busbar 606 until the latch 618 is removed from the groove 620. In the embodiment shown in FIG. 6-3, the latch 618 is rotated until the latch 618 is removed from the groove 620. The latch 618 may be connected to the busbar 606 with a pivot point about which the latch 618 rotates.

Figure 7:
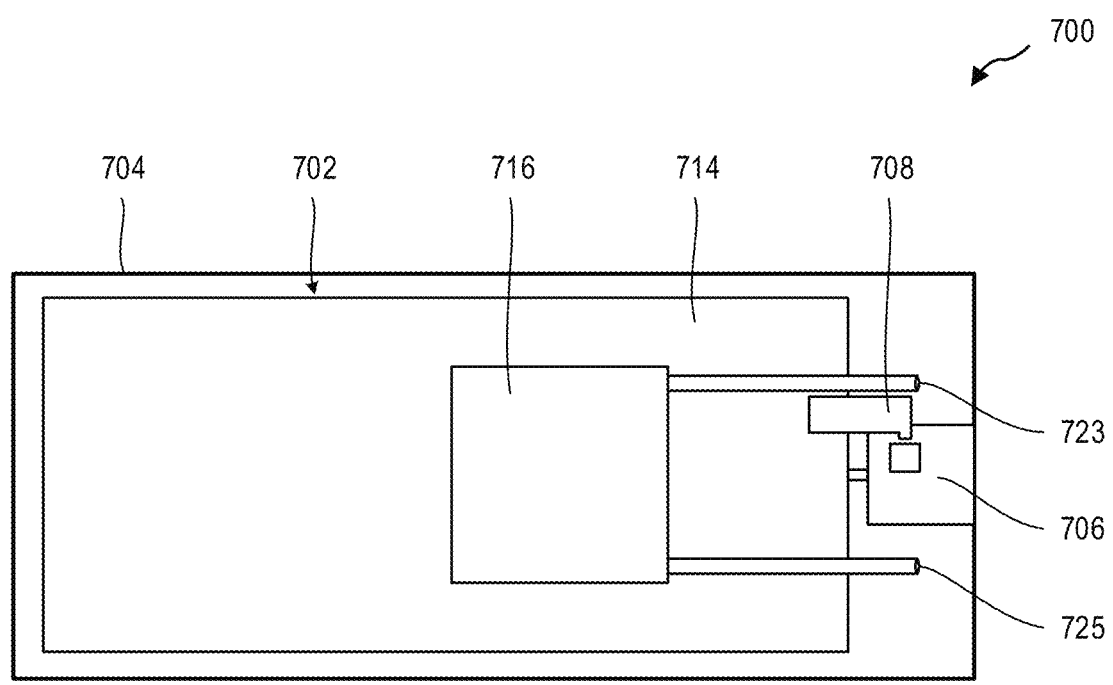
FIG. 7 is a representation of a top-down view of a rack 700 having a busbar 706 connected to a housing 704, according to at least one embodiment of the present disclosure.

FIG. 7 is a representation of a top-down view of a rack 700 having a busbar 706 connected to a housing 704, according to at least one embodiment of the present disclosure. A server device 702 includes a support structure 714 and a processor 716. The server device 702 is supported in the housing 704 of the rack 700 by the support structure 714. In some embodiments, the processor 716 may be powered by the busbar 706.

In accordance with at least one embodiment of the present disclosure, the server device 702 may be locked to the busbar 706 with a locking mechanism 708. Because the busbar 706 is connected to the housing 704, locking the server device 702 to the busbar 706 with the locking mechanism 708 may lock the server device 702 to the housing 704. As discussed herein, this may help to reduce unauthorized access to the server device 702.

In the embodiment shown, the rack 700 includes a cooling system, including an inlet 723 and an outlet 725. The inlet 723 may be the inlet for chilled cooling fluid to cool the processor 716 and the outlet 725 may be the outlet for warmed cooling fluid to be recirculated in the cooling system.

In accordance with at least one embodiment of the present disclosure, the locking mechanism 708 may include a connection to the cooling system. For example, the locking mechanism 708 may include fluid pipe connections to the inlet 723 pipe and the outlet 725 pipe. In this manner, when the locking mechanism 708 is changed between the locked position and the unlocked position, the locking mechanism 708 may also connect and disconnect the cooling system at the inlet 723 and the outlet 725. This may help to make installing and uninstalling the server device 702 "plug and play," or reduce the number of connections that are manually or individually made by the user or the technician. This may help to increase the ease of installation and removal of the server device 702.

Figure 8:
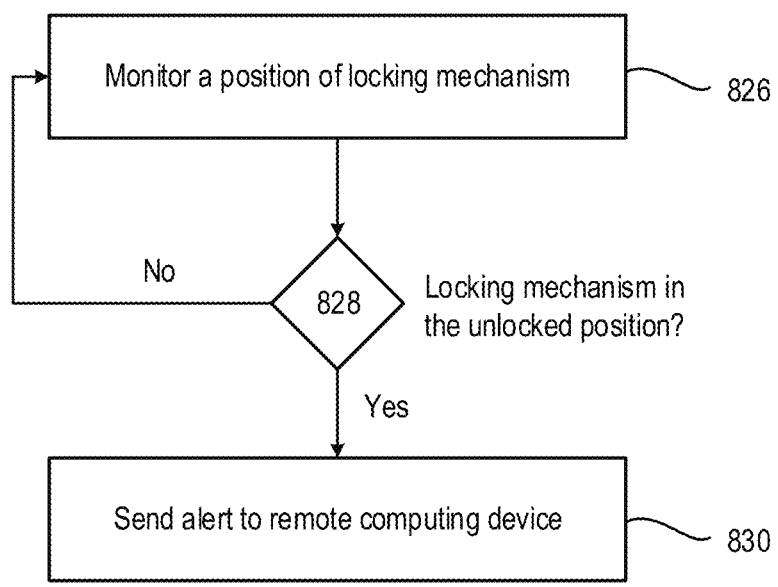
FIG. 8 is a flowchart of a method for rack security, according to at least one embodiment of the present disclosure.
Figure 9:
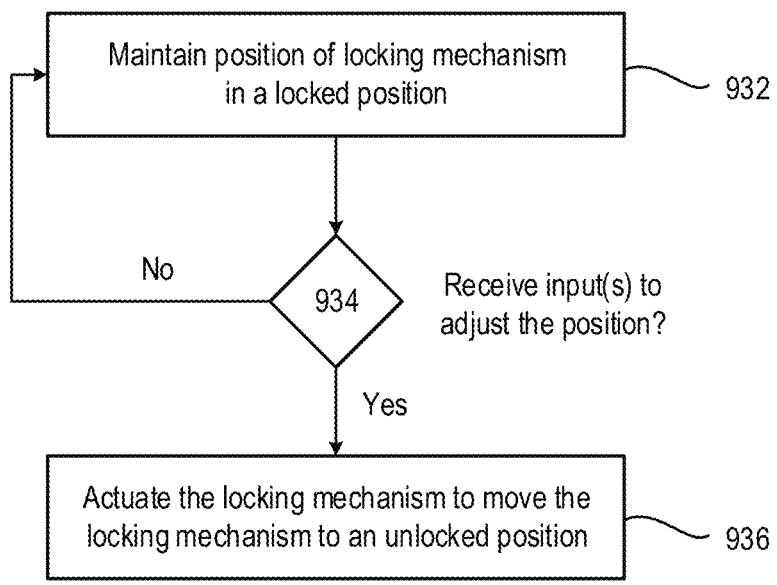
FIG. 9 is a flowchart of a method for rack security, according to at least one embodiment of the present disclosure.
Figure 10:
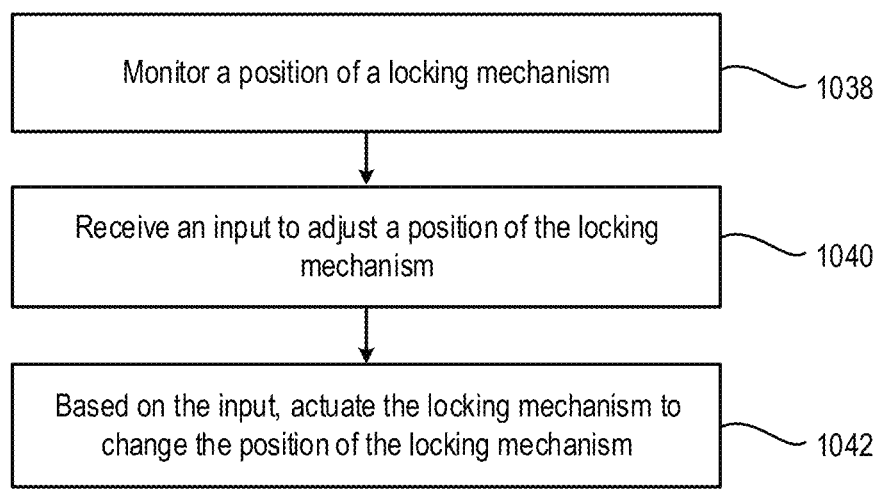
FIG. 10 is a flowchart of a method for rack security, according to at least one embodiment of the present disclosure.

FIGS. 8-10, the corresponding text, and the examples provide a number of different methods, systems, devices, and non-transitory computer-readable media of the rack security system. In addition to the foregoing, one or more embodiments can also be described in terms of flowcharts comprising acts for accomplishing a particular result, as shown in FIG. 8-10. FIG. 8-10 may be performed with more or fewer acts. Further, the acts may be performed in differing orders. Additionally, the acts described herein may be repeated or performed in parallel with one another or parallel with different instances of the same or similar acts.

As mentioned, FIG. 8 illustrates a flowchart of or a series of acts for rack security in accordance with one or more embodiments. While FIG. 8 illustrates acts according to one embodiment, alternative embodiments may omit, add to, reorder, and/or modify any of the acts shown in FIG. 8. The acts of FIG. 8 can be performed as part of a method. Alternatively, a non-transitory computer-readable medium can comprise instructions that, when executed by one or more processors, cause a computing device to perform the acts of FIG. 8. In some embodiments, a system can perform the acts of FIG. 8.

In the embodiment shown, the rack security system may monitor a position of a locking element at 826. As discussed herein, monitoring the position of the element may include receiving measurements of the position of the locking element from a position sensor or a status sensor. In some embodiments, the status sensor may periodically measure the position of the locking mechanism. For example, the status sensor may measure the position of the locking mechanism once a minute (0.017 Hz), once every 30 seconds (0.033 Hz), once every 15 seconds (0.067 Hz), once every 10 seconds (0.1 Hz), once every 5 seconds (0.2 Hz), once a second (1 Hz), twice a second (1 Hz), 5 times a second (5 Hz), 10 times a second (10 Hz), 100 times a second (100 Hz), or any rate therebetween.

In some embodiments, monitoring the position of the locking mechanism may include waiting for a position of the locking mechanism to change. For example, the status sensor may include a proximity sensor. The proximity sensor may detect when the locking mechanism moves into either the locked position or the unlocked position. For example, the proximity sensor may detect when the locking mechanism moves into the unlocked position. The proximity sensor may not be able to detect when the locking mechanism is in the locked position. Thus, the proximity sensor may only send a signal to the rack security system when the locking sensor moves into the unlocked position. This may reduce the number of sensor measurements taken by the proximity sensor.

In some embodiments, the rack security system may determine 828 whether the locking mechanism is in the locked position or in the unlocked position. If the locking mechanism is in the locked position, then the rack security system may continue to monitor the position of the locking mechanism. If the locking mechanism is in the unlocked position, then the rack security system may send an alert to a remote computing device (e.g., a rack manager, an operator, a technician, or other computing device or manager of a remote computing device) at 830. For example, the rack security system may send an alert identifying which server or servers were unlocked. In some examples, the rack security system may send an alert including a comparison of unlocked servers to which servers are authorized to be unlocked. In some embodiments, the rack security system may not send an alert or may only send an alert if the unlocked server was unauthorized to be unlocked. This may help to increase the physical security of the rack and/or server devices.

As mentioned, FIG. 9 illustrates a flowchart of or a series of acts for rack security in accordance with one or more embodiments. While FIG. 9 illustrates acts according to one embodiment, alternative embodiments may omit, add to, reorder, and/or modify any of the acts shown in FIG. 9. The acts of FIG. 9 can be performed as part of a method. Alternatively, a non-transitory computer-readable medium can comprise instructions that, when executed by one or more processors, cause a computing device to perform the acts of FIG. 9. In some embodiments, a system can perform the acts of FIG. 9.

In the embodiment shown, a rack security system may maintain a position of a locking mechanism securing a server device to a busbar in a locked position at 932. In some embodiments, the locking mechanism may be maintained in the locked position by a biasing element. For example, the locking mechanism may be biased into the locked position such that, when the server device is inserted into the rack, the biasing element may push the locking mechanism into the locked position. In some embodiments, the locking mechanism may actively urge the latches into the locked position, such as through a motor or other active system. In some embodiments, the locking mechanism may be biased into the locked position when the locking mechanism is unpowered. For example, the locking mechanism may include a solenoid, and, when the solenoid is unpowered (e.g., unpowered, or when no power is applied to the solenoid), the locking mechanism may be urged to the locked position.

In some embodiments, the rack security system may determine 934 whether it has received one or more inputs to adjust the position of the locking mechanism. If no input was received (e.g., based on no input), then the rack security system may continue to maintain the locking mechanism in the locked position. In some embodiments, the rack security system may receive a single input and, based on the single input, may automatically adjust or change the position of the locking mechanism. In some embodiments, the rack security system may receive a first input and a second input to adjust the position of the locking mechanism. For example, the rack security system may receive a first input from a remote computing device, such as a rack manager. The rack security system may receive a second input from a technician or other operator. In some embodiments, actuating the locking mechanism does not occur or may not occur until after the first and the second input are received. Put another way, the locking mechanism may be actuated based on a receipt of the first input and the second input. This may further help to increase the physical security of the server device.

In some embodiments, one of the inputs may include a physical input from the technician or other operator. For example, the first input may be an authorization to the rack security system by the rack manager, and the second input may be a physical input, such as an input code, toggling a latch, or otherwise physically applying an input to the server device, the locking mechanism, or other element of the rack. In some embodiments, the physical input may be received first, and based on the receipt of the physical input, the rack security system may request authorization from the rack manager. For example, the technician may request access to a particular server device, and the rack manager may request permission to adjust the position of the locking mechanism.

If the rack security system receives an input to adjust the position of the locking mechanism, then the rack security system may actuate the locking mechanism to move the locking mechanism to the unlocked position at 936. Put another way, after receiving an input to adjust the position of the locking mechanism, the rack manager may actuate the locking mechanism to adjust the locking mechanism into the unlocked position.

As mentioned, FIG. 10 illustrates a flowchart of or a series of acts for rack security in accordance with one or more embodiments. While FIG. 10 illustrates acts according to one embodiment, alternative embodiments may omit, add to, reorder, and/or modify any of the acts shown in FIG. 10. The acts of FIG. 10 can be performed as part of a method. Alternatively, a non-transitory computer-readable medium can comprise instructions that, when executed by one or more processors, cause a computing device to perform the acts of FIG. 10. In some embodiments, a system can perform the acts of FIG. 10.

A rack security system may monitor a position of a locking mechanism at 1038. The locking mechanism is movable between an unlocked position and a locked position. In the unlocked position, the locking mechanism is locked to the busbar and prevents removal of the server from the rack, with the busbar being connected to the rack. In the locked position, the server is removable from the rack. As discussed herein, the rack security system may actively or passively monitor the position of the locking mechanism.

The rack security system may receive an input to adjust a position of the locking mechanism from the locked position to the unlocked position at 1040. In some embodiments, the input may be sent from a rack manager, from an owner of the physical server devices, from an owner of the data and/or programs stored on the server devices, from any other source authorized to unlock the locking mechanism, and combinations thereof. Based on the input, the rack security system may actuate the locking mechanism to change the position of the locking mechanism from the locked position to the unlocked position such that the server is removable from the rack at 1042.

One or more specific embodiments of the present disclosure are described herein. These described embodiments are examples of the presently disclosed techniques. Additionally, in an effort to provide a concise description of these embodiments, not all features of an actual embodiment may be described in the specification. It should be appreciated that in the development of any such actual implementation, as in any engineering or design project, numerous embodiment-specific decisions will be made to achieve the developers' specific goals, such as compliance with system-related and business-related constraints, which may vary from one embodiment to another. Moreover, it should be appreciated that such a development effort might be complex and time consuming, but would nevertheless be a routine undertaking of design, fabrication, and manufacture for those of ordinary skill having the benefit of this disclosure.

The articles "a," "an," and "the" are intended to mean that there are one or more of the elements in the preceding descriptions. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. For example, any element described in relation to an embodiment herein may be combinable with any element of any other embodiment described herein. Numbers, percentages, ratios, or other values stated herein are intended to include that value, and also other values that are "about" or "approximately" the stated value, as would be appreciated by one of ordinary skill in the art encompassed by embodiments of the present disclosure. A stated value should therefore be interpreted broadly enough to encompass values that are at least close enough to the stated value to perform a desired function or achieve a desired result. The stated values include at least the variation to be expected in a suitable manufacturing or production process, and may include values that are within 5%, within 1%, within 0.1%, or within 0.01% of a stated value.

A person having ordinary skill in the art should realize in view of the present disclosure that equivalent constructions do not depart from the spirit and scope of the present disclosure, and that various changes, substitutions, and alterations may be made to embodiments disclosed herein without departing from the spirit and scope of the present disclosure. Equivalent constructions, including functional "means-plus-function" clauses are intended to cover the structures described herein as performing the recited function, including both structural equivalents that operate in the same manner, and equivalent structures that provide the same function. It is the express intention of the applicant not to invoke means-plus-function or other functional claiming for any claim except for those in which the words 'means for' appear together with an associated function. Each addition, deletion, and modification to the embodiments that falls within the meaning and scope of the claims is to be embraced by the claims.

The terms "approximately," "about," and "substantially" as used herein represent an amount close to the stated amount that still performs a desired function or achieves a desired result. For example, the terms "approximately," "about," and "substantially" may refer to an amount that is within less than 5% of, within less than 1% of, within less than 0.1% of, and within less than 0.01% of a stated amount. Further, it should be understood that any directions or reference frames in the preceding description are merely relative directions or movements. For example, any references to "up" and "down" or "above" or "below" are merely descriptive of the relative position or movement of the related elements.

The present disclosure may be embodied in other specific forms without departing from its spirit or characteristics. The described embodiments are to be considered as illustrative and not restrictive. The scope of the disclosure is, therefore, indicated by the appended claims rather than by the foregoing description. Changes that come within the meaning and range of equivalency of the claims are to be embraced within their scope.

What is claimed is:

1. A server in a rack of servers, comprising:
a support structure;
a processor on the support structure; and
a means for locking the support structure to a busbar, the means for locking preventing removal of the support structure from the rack of servers through a connection to the busbar.

2. The server of claim 1, wherein the means for locking is biased to a locked position.

3. The server of claim 1, wherein the means for locking includes:
a latch configured to lock with the busbar, the latch having a locked position in which the latch is locked with the busbar and an unlocked position in which the support structure is removable from the rack; and
a solenoid configured to move the latch between the locked position and the unlocked position.

4. The server of claim 3, wherein the latch is in the locked position when the solenoid is unpowered.

5. The server of claim 1, further comprising a status sensor connected to the means for locking, the status sensor detecting a position of the locking mechanism.

6. The server of claim 1, wherein the means for locking is configured to be actuated only after receiving an electronic input from a remote computing device.

7. The server of claim 1, further comprising a biasing element, wherein the biasing element is disposed to push the support structure out of the rack until a portion of the support structure is located out of the rack, wherein, when the locking mechanism is in an unlocked position, the portion of the support structure is located out of the rack.

8. The server of claim 7, wherein the biasing element pushes the support structure away from the busbar.

9. A rack in a datacenter, comprising:
a housing;
a plurality of servers located in the housing;
a busbar connected to the housing and configured to provide power to the plurality of servers; and
a means for preventing removal of the plurality of servers from the rack by locking the plurality of servers to the busbar through a connection of the server to the busbar.

10. The rack of claim 9, wherein the means for locking includes a plurality of locking mechanisms, each locking mechanism of the plurality of locking mechanisms being in electronic communication with a server of the plurality of servers.

11. The rack of claim 7, wherein the means for locking includes:
a latch configured to lock with the busbar, the latch having a locked position in which the latch is locked with the busbar and an unlocked position in which the plurality of servers are removable from the rack; and
a solenoid configured to move the latch between the locked position and the unlocked position.

12. The rack of claim 11, wherein the latch is in the locked position when the solenoid is unpowered.

13. The rack of claim 9, wherein the plurality of servers are biased out of the rack, and wherein, when the means for locking is in an unlocked position, a portion of each server of the plurality of servers extend out of the housing.

14. The rack of claim 9, further comprising a status sensor connected to the means for locking, the status sensor detecting a position of the means for locking between an unlocked position and a locked position.

15. The rack of claim 14, wherein when the status sensor detects the means for locking is in the unlocked position, an alert is sent to a remote computing device.

16. A method for rack security, comprising:
monitoring a position of a locking mechanism, the locking mechanism being adjustable between an unlocked position and a locked position, wherein, in the unlocked position, the locking mechanism is locked to a busbar and prevents removal of a server from a rack, the busbar being connected to the rack, and wherein, in the locked position, the server is removable from the rack;
receiving an electronic input to adjust a position of the locking mechanism from the locked position to the unlocked position; and
based on the electronic input, actuating the locking mechanism to adjust the position from the locked position to the unlocked position such that the server is removable from the rack.

17. The method of claim 16, wherein the electronic input is a first electronic input, and further comprising receiving a second electronic input adjust the position of the locking mechanism from the locked position to the unlocked position, and wherein actuating the locking mechanism is based on the first electronic input and the second electronic input.

18. The method of claim 17, wherein actuating the locking mechanism does not occur until receiving the first electronic input and the second electronic input.

19. The method of claim 17, wherein receiving the second electronic input includes receiving the second electronic input from a remote computing device.

20. The method of claim 16, wherein monitoring the position of the locking mechanism includes detecting that the locking mechanism is in the unlocked position, and further comprising, based on detecting the locking mechanism in the unlocked position, sending an alert to a remote computing device.

21. The method of claim 16, wherein the server includes a plurality of servers, and wherein monitoring the position of the locking mechanism includes monitoring the position of a plurality of locking mechanisms on the rack, each locking mechanism of the plurality of locking mechanisms being associated with a server of the plurality of servers.

22. The method of claim 16, wherein the server includes a plurality of servers and the locking mechanism includes a plurality of locking mechanisms, each locking mechanism of the plurality of locking mechanisms being associated with a server of the plurality of servers, wherein receiving the electronic input includes receiving the electronic input to unlock a particular server of the plurality of servers, and wherein actuating the locking mechanism includes actuating a particular locking mechanism of the plurality of locking mechanisms associated with the particular server of the plurality of servers.

* * * * *